(12) United States Patent
Hsiao

(10) Patent No.: US 6,699,756 B1
(45) Date of Patent: Mar. 2, 2004

(54) FOUR-TRANSISTOR STATIC-RANDOM-ACCESS-MEMORY AND FORMING METHOD

(76) Inventor: Chih-Yuan Hsiao, 7F, No. 198, San-Cheng Rd., Feng-Shan City, Kaohsiung (TW)

( * ) Notice: Subject to any disclaimer, the term of this patent is extended or adjusted under 35 U.S.C. 154(b) by 130 days.

(21) Appl. No.: 09/715,658

(22) Filed: Nov. 17, 2000

(51) Int. Cl.⁷ .............................................. H01L 21/336
(52) U.S. Cl. ...................... 438/259; 438/163; 438/296; 257/296
(58) Field of Search ................................. 438/163, 238, 438/257–258, 296; 257/396, 395, 394, 393, 392, 296–297, 298, 321

(56) References Cited

U.S. PATENT DOCUMENTS 5,831,899 A * 11/1998 Wang et al. ................ 257/377

* cited by examiner

Primary Examiner—D Le
(74) Attorney, Agent, or Firm—Dickinson Wright PLLC

(57) ABSTRACT

A method for forming four transistors static-random-access-memory. The method comprises the steps of: providing a substrate which at least comprises a cell region and periphery region, wherein the cell region comprises a first P-type region, a second P-type region, a first N-type region and a second N-type region, the periphery region comprises numerous periphery P-type regions and numerous periphery N-type regions; covering the first P-type region, the second P-type region and the periphery P-type region by a first photoresist; forming numerous N-type sources and numerous N-type drains in the first P-type region, the second P-type region and the periphery P-type regions; removing the first photoresists using a second photoresist to cover the periphery N-type regions and some the N-type drains which are located in both the first N-type region and the second N-type regions and performing a large angle implanting process to form numerous P-type enlarged drains and numerous P-type enlarged sources in the periphery P-type regions, the first P-type region and the P-type second region, wherein numerous P-type extra sources also are formed on outside of some the N-type drains which are located in both the first N-type region and the second N-type region.

10 Claims, 4 Drawing Sheets

FOUR-TRANSISTOR STATIC-RANDOM-ACCESS-MEMORY AND FORMING METHOD

BACKGROUND OF THE INVENTION

1. Field of the Invention

This invention relates generally to a method for forming a four-transistor static-random-access-memory (SRAM) memory cell, and also is related to a structure of the four-transistors SRAM cell.

2. Description of the Prior Art

To meet customer demand for small size and low power products, manufacturers are producing newer integrated circuits (ICs) that operate with lower supply voltages and that include smaller internal subcircuits. Many ICs, such as memory circuits or other circuits such as microprocessors that include onboard memory, include one or more SRAM cells for data storage. SRAMs cells are popular because they operate at a higher speed than dynamic random-access-memory (DRAM) cells, and as long as they are powered, they can store data indefinitely, unlike DRAM cells, which must be periodically refreshed.

The conventional structure of the SRAM cell is a six-transistor SRAM cell, which means six transistors are used to form an SRAM cell. In general, advantages of the six-transistor SRAM at least include high speed and the possibility of low supply voltage. Unfortunately, one unavoidable disadvantage is that the area of the six-transistor SRAM cell is large, and the disadvantage is more serious and it is desired to overcome the disadvantage by either improving the structure of the six-transistor SRAM cell or providing a new SRAM cell. Therefore, four-transistors SRAM is present to replace the conventional six-transistors SRAM cell. Clearly, owing to the fact that the number of transistors is decreased, the occupied area of four-transistor SRAM cell is less than the six-transistor SRAM cell. Thus, the four-transistor SRAM cell is more suitable for ICs whenever the sizes of ICs are reduced, and even four-transistors also have some disadvantages such as higher off-state leakage current of PMOS. More background on four-transistor SRAM cell can be acquired by referring to IEEE IEDM 98-643 to IEDM 98-646, U.S. Pat. Nos. 5,943,269, 6,091,628, 6,044,011, 6,011,726, 5,751,044.

One ordinary circuit diagram of a four-transistor SRAM cell is shown in FIG. 1. The four-transistor SRAM cell, which is a loadless four-transistor SRAM cell, comprises first transistor 11, second transistor 12, third transistor 13 and fourth transistor 14. Moreover, source of third transistor 13 is electrically coupled with the drain of first transistor 11 and the gate of third transistor 13 is electrically coupled with drain of second transistor 12, source of fourth transistor 14 is electrically coupled with drain of second transistor 12 and gate of fourth transistor 14 is electrically coupled with drain of first transistor 11.

Leakage current of first transistor 11 and leakage current of second transistor 12 are not absolute zero, especially when first transistor 11/second transistor 12 are P-type transistors. An unavoidable shortage is that third transistor 13 is turned on by leakage current of second transistor 12 whenever both first transistor 11 and second transistor 12 are not totally turned off. Thus, whenever current is sent into the four-transistor SRAM cell for storing data, owing to both first transistor 11 and third transistor 13 being not totally turned off, current continually flows through first transistor 11 and third transistor 13. Significantly, continuous flow of current requires continuous supply of current, then stand-by current is not negligible and the four-transistor SRAM cell is less suitable for low power product.

An ordinary solution to this problem is increasing the threshold voltage of both third transistor 13 and fourth transistor 14 to prevent third transistor 13 (fourth transistor 14) being turned on by leakage current of second transistor 12 (first transistor 11). In this way, after numerous P-type transistors and numerous N-type transistors are formed in and on a substrate which at least includes a cell region and a periphery region, an additional implant mask (sometimes referred to as additional implant photoresist) is used to cover all P-type transistors and part of N-type transistors which are located in the periphery region, and then threshold voltages of part of N-type transistors which are located in said cell region is adjusted, for example, by an ion implanting process. Obviously, application of the additional implant mask not only complicates fabrication of the four-transistor SRAM but also increases cost of the four-transistor SRAM.

In short, the four-transistor SRAM still is not suitable for operation at low power supply, and corresponding improvement incorporates complicated fabrication and increased cost. Thus, it is desired to improve current fabrication, even the structure, of the four-transistor SRAM, to make the four-transistor SRAM more suitable for a low power device.

SUMMARY OF THE INVENTION

One main object of the invention is to present a method for forming a four-transistor SRAM cell without the application of an additional implant mask.

Another important object of the invention is to present a method for forming a four-transistor SRAM cell, whereby the adjusting process of some of the transistors are incorporated into the forming process of sources/drains of some transistors.

Still an essential object of the invention is to present a structure of a four-transistor SRAM cell, whereby the layout of the present structure is similar to a conventional structure, but the structures of transistors are different from conventional structures of transistors.

One preferred embodiment of the invention is a method for forming a four-transistor static-random-access-memory. The method comprises the steps of: providing a substrate which at least comprises a cell region and a periphery region, wherein the cell region comprises a first P-type region, a second P-type region, a first N-type region and a second N-type region, the periphery region comprises numerous periphery P-type regions and numerous periphery N-type regions; covering the first P-type region, the second P-type region and the periphery P-type regions by a first photoresist; forming numerous N-type sources and numerous N-type drains in the first N-type region, the second N-type region and the periphery N-type regions. Remove the first photoresist; using a second photoresist to cover the periphery N-type regions and some of the N-type drains which are located in both the first N-type region and the second N-type region; performing a large angle implanting process to form numerous P-type enlarged drains and numerous P-type enlarged sources in the periphery P-type regions, the first P-type region and the P-type second region, wherein numerous P-type extra sources also are formed on outsides of some of the N-type drains which are located in both the first N-type region and the second N-type region.

Another preferred embodiment of the invention is a four-transistor static-random-access-memory cell, which comprises: a first P-type transistor, a second P-type transistor, a first N-type transistor and a second N-type transistor. The first P-type transistor comprise a first P-type enlarged source, a first P-type enlarged drain and a first gate, wherein the distance between the second P-type enlarged source and the first P-type enlarged drain is larger than the width of the first gate. The second P-type transistor comprises a second P-type enlarged source, a second P-type enlarged drain and a second gate, wherein the distance between the second P-type enlarged source and the second P-type enlarged drain is larger than the width of the second gate. The first N-type transistor comprises a first n-type drain, a first N-type source, a third gate and a first P-type extra source, wherein the first P-type extra source is located outside the first N-type source, and the distance between the first N-type source and the first N-type drain is less than the width of the third gate. The second N-type transistor comprises a second n-type drain, a second N-type source, a fourth gate and a second P-type extra source, wherein the second P-type extra source is located outside the second N-type source, and the distance between the second N-type source and the second N-type drain is less than the width of the third gate. The second N-type transistor comprises a second n-type drain, a second N-type source, a fourth gate and a second p-type extra source, wherein the second P-type extra source is located outside the second N-type source, and the distance between the second N-type source and the second N-type drain is less than the width of the fourth gate, the second N-type source is electrically coupled with both the second P-type drain and the third gate and the fourth gate is electrically coupled with both the first P-type drain and the first N-type source.

BRIEF DESCRIPTION OF THE DRAWINGS

A more complete appreciation and many of the attendant advantages thereof will be readily obtained as the same becomes better understood by reference to the following detailed description when considered in connection with the accompanying drawings.

DESCRIPTION OF THE PREFERRED EMBODIMENT

Figure 1:
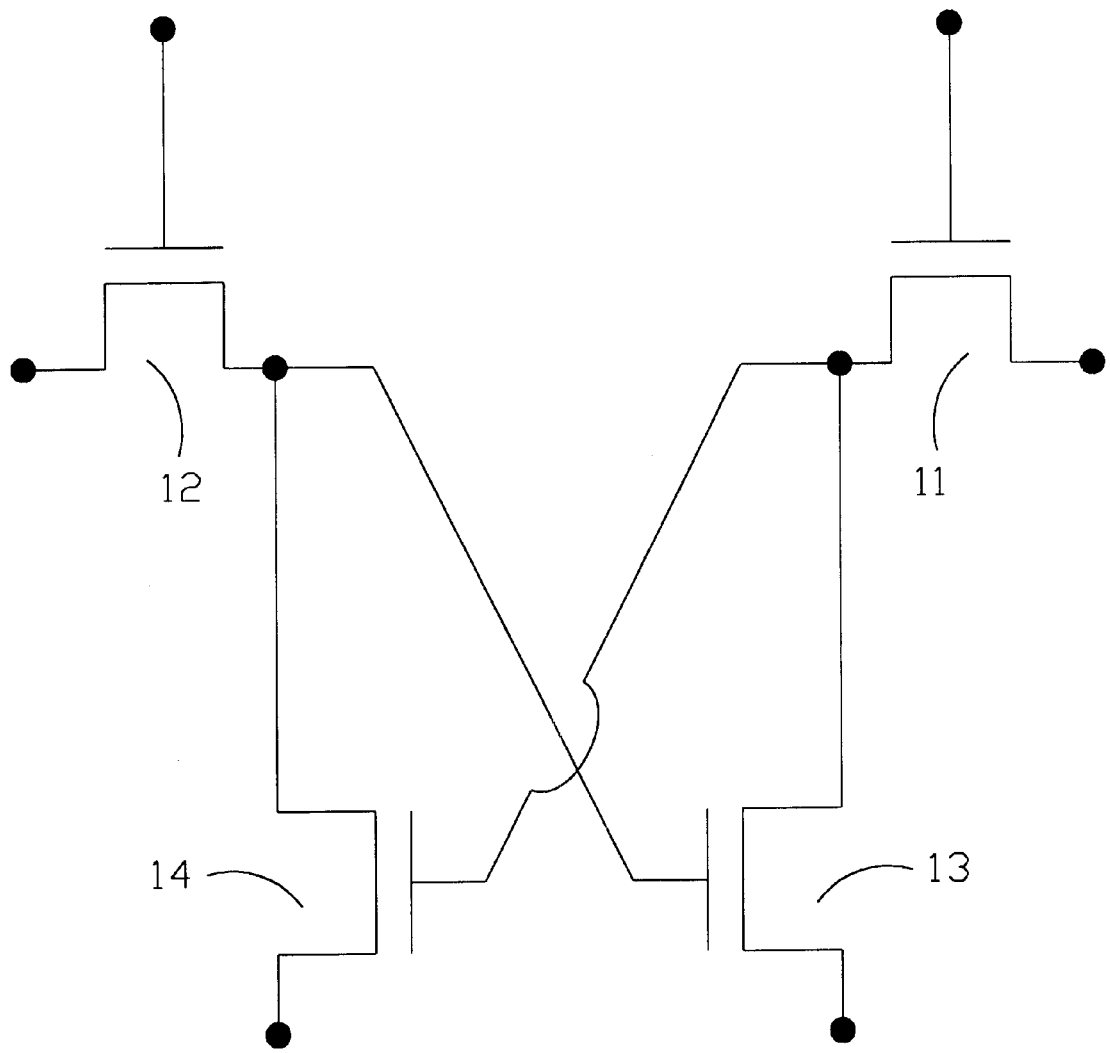
FIG. 1 is a circuit layout diagram of a conventional four-transistor SRAM cell.
Figure 2A:
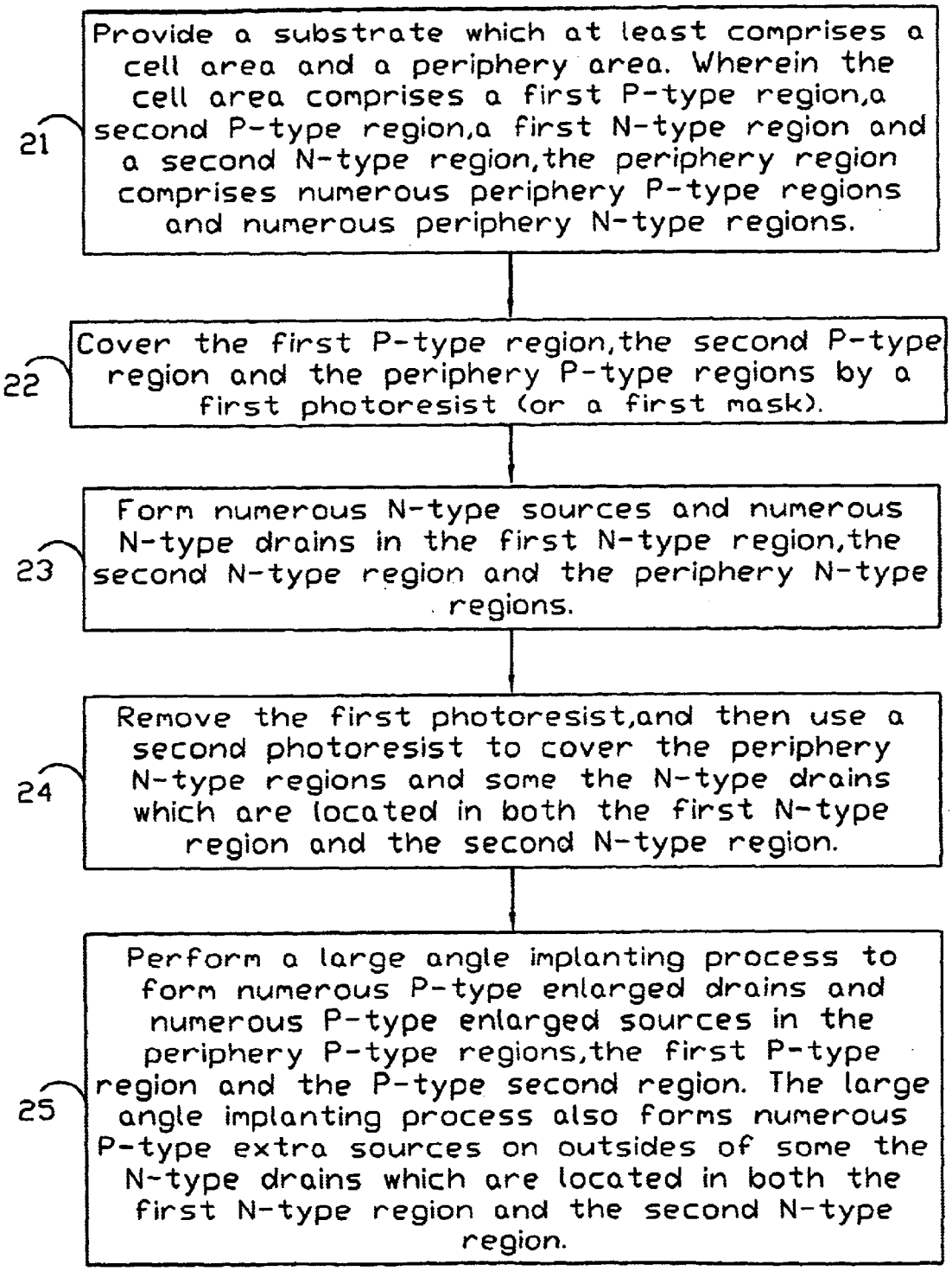
FIG. 2 is a brief flow chart of a method according to the present invention for forming a four-transistor SRAM.

One preferred embodiment of the invention is a method for forming a four-transistor static-random-access-memory. As shown in FIG. 2, the method at least includes the following steps:

As providence block 21 shows, a substrate is provided which at least includes a cell region and a periphery region. The cell region comprises a first P-type region, a second P-type region, a first N-type region and a second N-type region. The periphery region comprises numerous periphery P-type regions and numerous periphery N-type regions.

As N-type preparation block 22 shows, the first P-type region, the second P-type region and the periphery P-type regions are covered by a first photoresist (or a first mask).

As N-type formation block 23 shows, numerous N-type sources and numerous N-type drains are formed in the first P-type region, the second P-type region and the periphery P-type regions.

As P-type preparation block 24 shows, a large angle implanting process is performed to form numerous P-type enlarged drains and numerous P-type enlarged sources in the periphery P-type regions, the first P-type region and the P-type second region. The large angle implanting process also forms numerous P-type extra sources on the outsides of some of the N-type drains which are located in both the first N-type region and the second N-type region.

As P-type formation block 25 shows, perform a large angle implanting process to form numerous P-type enlarged drains and numerous P-type enlarged sources in the periphery P-type regions, the first P-type region and the P-type second region. The large angle implanting process also forms numerous P-type extra sources on outsides of some the N-type drains which are located in both the first N-type region and the second N-type region.

Furthermore, in order to clearly explain more details of the prefer embodiment, the cross-sectional view of the embodiment is shown in FIG. 2B through FIG. 2G. However, because the embodiment only amends the structure of each MOS of the four transistors SRAM, the structure of the first P-type MOS is equal to that of the second P-type MOS and the structure of the first N-type MOS is equal to that of the second N-type MOS. In other words, except the details of layout, the first P-type region is essentially equal to the second P-type region and the first N-type region is essentially equal to the second N-type region. Hence, in order to simply FIG. 2B through FIG. 2E, only one P-type region and one N-type region are shown in the cell area. Moreover, from FIG. 2B to FIG. 2E, substrate is labeled as 200, each gate is labeled as 201, each first photoresist is labeled as 202, each N-type source is labeled as 203, each N-type drain is labeled as 204, each second photoresist is labeled as 205, each P-type drain is labeled as 206, each P-type drain is labeled as 207, and each P-type extra source is labeled as 208. Note that although no spacer is shown in these figures, the invention does not require the spacer is absent. In fact, the invention just does not limit when the spacer(s) is formed.

Figure 3A:
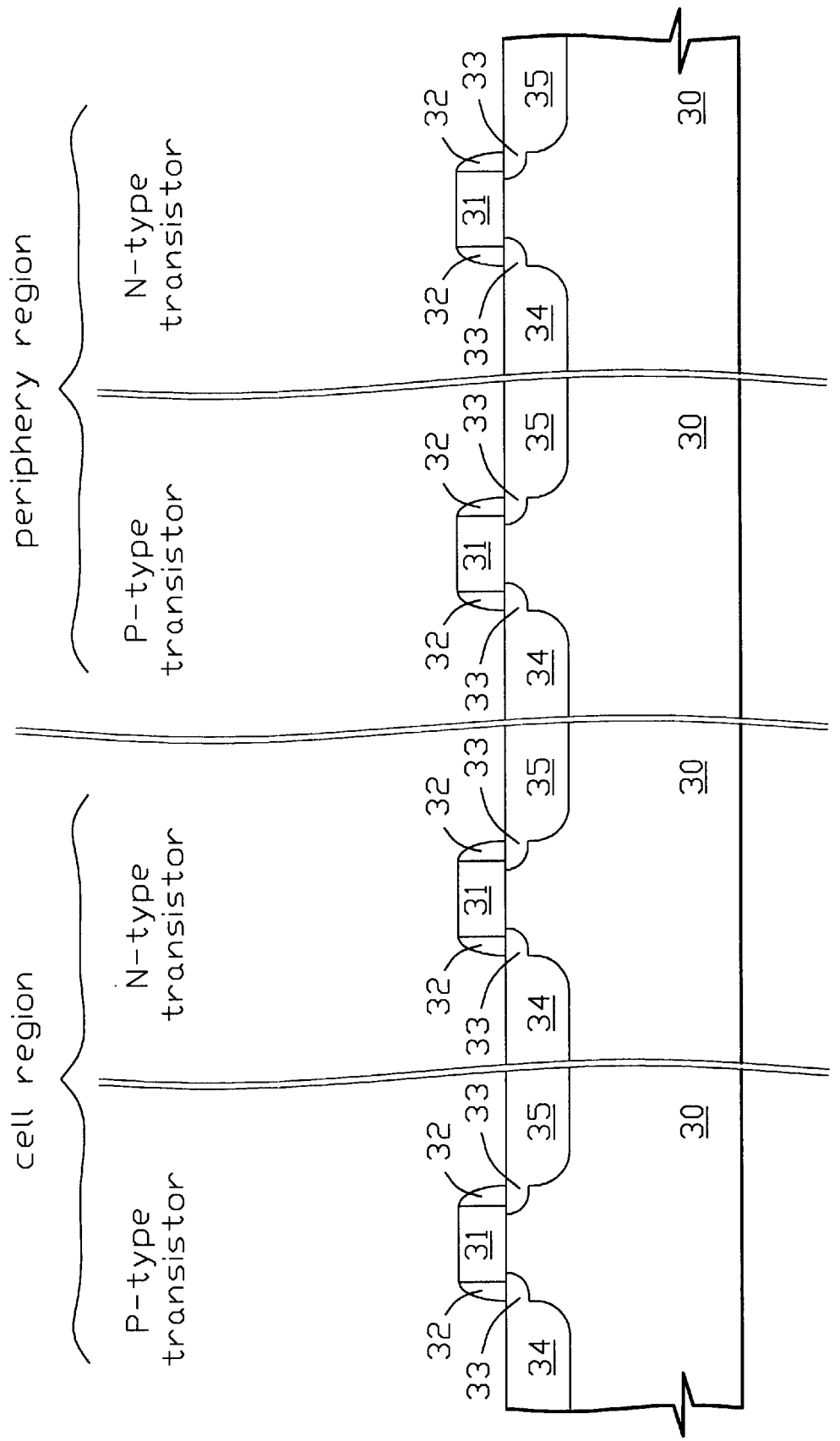
FIG. 3A and FIG. 3B separately briefly illustrate elements of a conventional four-transistor SRAM and the four-transistor SRAM of the present invention.

Without question, after the large angle implanting process is processed, structures of each P-type transistor and each N-type transistor of the four-transistors SRAM cell will be different from structures of each P-type transistor and each N-type transistor of the conventional four-transistor SRAM cell. FIG. 3A briefly illustrates elements of the conventional four-transistor SRAM and FIG. 3B briefly illustrates elements of the four-transistor SRAM formed by the invention. However, it should be noted that details of substrate 30, gate 31 and spacer 32 are irrelevant to the invention. Besides, both FIG. 3A and FIG. 3B are only qualitative illustrations, and they do not limit the practical configuration or the layout of the four-transistor SRAM.

Figure 3B:
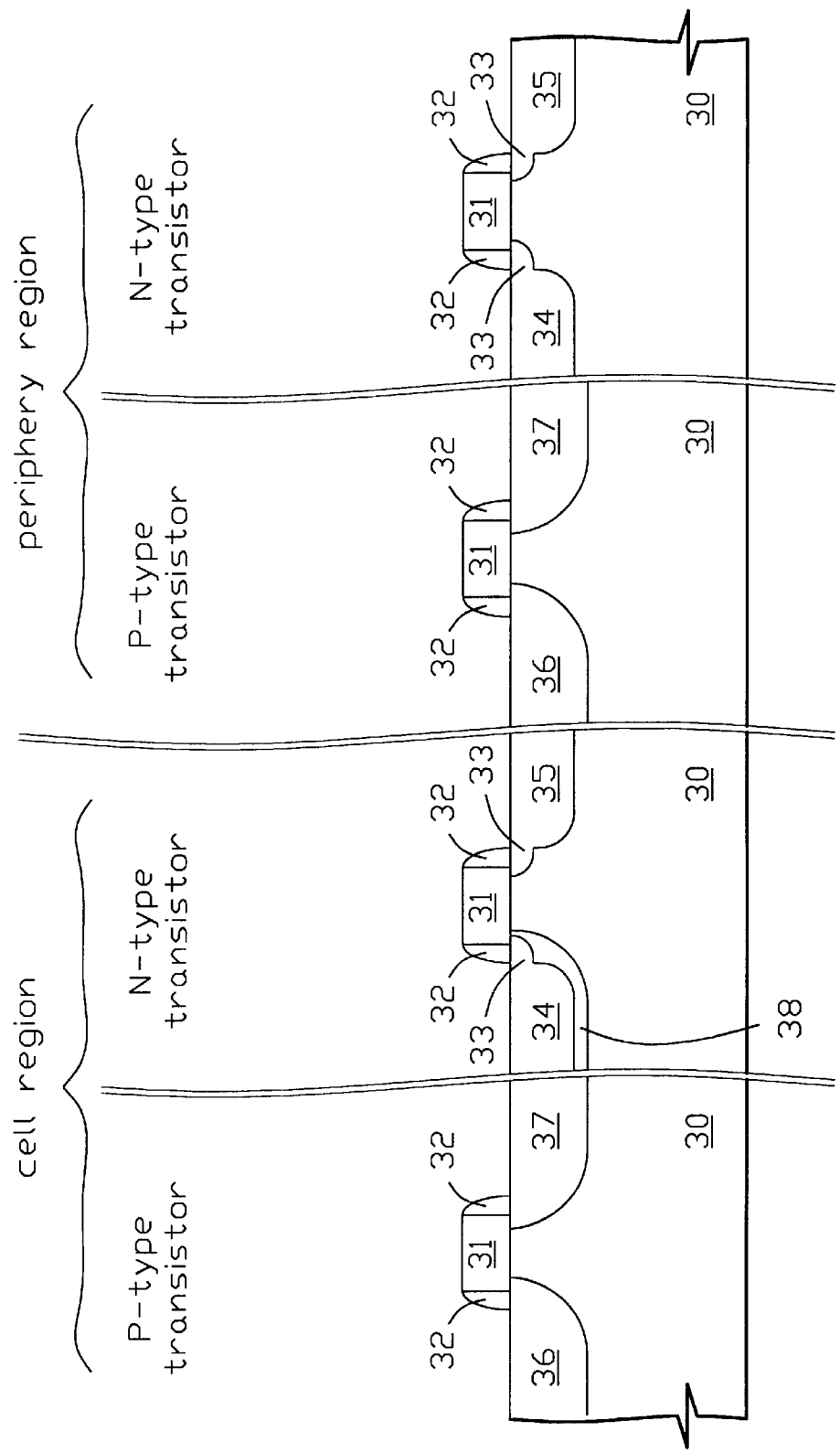

By comparing FIG. 3B with FIG. 3A, it is clear that by application of the preferred embodiment, any P-type transistor, either located in the cell region or in the periphery region, has no light doped region 33. In fact, each P-type transistor replaces source 34, drain 35 and light doped region 33 of conventional structure by P-type enlarged source 36 and P-type enlarged drain 37. Regardless, properly adjusted parameters (ion energy, ion density and the implanted angle) of the large angle implanting process allow the distance between P-type enlarged source 36 and P-type enlarged drain 37 of a P-type transistor to be briefly equal to the distance between the two light doped drains of the P-type transistor. In other words, performance of P-type transistors formed by the invention is similar to performance of P-type transistors of conventional technology, and then it is not necessary to modify the layout of the four-transistor SRAM.

By comparing FIG. 3B with FIG. 3A, it also is clear that the structure of N-type transistors in the periphery region is equal to the structure of conventional transistors but the structure of N-type transistors in the cell region is different from the conventional transistors. As shown in FIG. 3B, for each N-type transistor in the cell region formed by the embodiment, one O-type extra source 38 is located outside the corresponding N-type source. Obviously, because carriers of N-type transistor are electrons and carriers of P-type transistor are holes, existence of P-type extra source 38, which is located between source 34 and drain 35 of one N-type transistor, will allow the N-type to be not turned on until the voltage is enough large to overcome prevention of P-type extra source 38. Certainly, while the voltage difference between drain 35 and source 34 is large enough, drain 35 always can induce a current flow from source 34 to drain 35. This is the so-called "drain induced barrier low" (DIBL). As a result, the embodiment can increase the threshold voltage of N-type transistors in the cell region (because it is desired to overcome interference of the P-type extra source), but will not increase the threshold voltage of N-type transistors in the periphery region (because they are covered by second photoresist).

Furthermore, as FIG. 2 indicates, the present method of the invention only requires two masks. One of the masks is used to form all N-type transistors (both cell region and periphery region), and the other one is used to form all P-type transistors (both cell region and periphery region) and to adjust threshold voltage of some N-type transistors which are located in the cell region. In contrast, according to the conventional method three masks are required: one for forming all P-type transistors, one for forming an N-type transistor and another for adjusting the threshold voltage of some N-type transistors in the cell region. Obviously, the present method does not need the additional implant mask, then fabrication is not complicated and the cost is not increased. Of course, second masks of the invention is different from the mask used by conventional technology to form all P-type transistors, the second mask does not cover drains of some N-type transistors in the cell region.

Next, as disclosed in previous discussions, the layout of the four-transistor SRAM formed by the present method is equivalent to the layout of the conventional four-transistor SRAM. The main difference only is that structures of the transistors are modified, as shown in FIG. 3B.

Furthermore, because the process of the method is independent of the number of transistors, the method can be applied to adjust the threshold voltage of some transistors of a multi-transistors memory cell which comprises numerous P-tape transistors and numerous N-type transistors. Certainly, the cell and periphery of the multi-transistors memory are formed simultaneously.

Another preferred embodiment of the invention is a four-transistors static-random-access-memory cell which comprises: a first P-type transistor, a second P-type transistor, a first N-type transistor and a second N-type transistor. The first P-type transistor comprise a first P-type enlarged source, a first P-type enlarged drain and a first gate, wherein the distance between the first P-type enlarged source and the first P-type enlarged drain is larger than the width of the first gate. The second P-type transistor comprises a second P-type enlarged source, a second P-type enlarged drain and a second gate, wherein the distance between the second P-type enlarged source and the second P-type enlarged drain is larger than the width of the second gate. The first N-type transistor comprises a first n-type drain, a first N-type source, a third gate and a first P-type extra source, wherein the first P-type extra source is located outside the first N-type source, and the distance between the first N-type source and the first N-type drain is less than the width of the third gate. The second N-type transistor comprises a second n-type drain, a second N-type source, a fourth gate and a second p-type extra source, wherein the second P-type extra source is located outside the second N-type source, and the distance between the second N-type source and the second N-type drain is less than the width of the fourth gate, the second N-type source is electrically coupled with both the second P-type drain and the third gate and the fourth gate is electrically coupled with both the first P-type drain and the first N-type source.

In addition, the third gate and the source gate usually are electrically coupled with an electrically zero point. Any of the first P-type transistor and the second P-type transistor has no P-type light doped region, and any of the first N-type transistor and the second N-type transistor usually further comprise an N-type light doped region. Besides, each P-type extra source is located outside the neighboring N-type light doped region, and the threshold voltage of the N-type transistors is larger than the threshold voltage of the P-type transistors.

Again, it should be emphasized that the embodiment only limits structures of P-type transistors and structures of N-type transistors which are used to form four-transistor static-random-access-memory cell, and does not limit the layout of the four-transistor static-random-access-memory cell. Further, although the embodiment is similar to the produced structure of the previous embodiment the embodiment is not limited by the method used to form the present structure.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming four transistors static-random-access-memory, comprising:

providing a substrate which at least comprises a cell area and a periphery area, said cell area being separated from said periphery area, wherein said cell area comprises a first P-type region, a second P-type region, a first N-type region and a second N-type region, each of said region inside said cell area being separated from other said regions of said area, wherein said periphery region comprises a plurality of periphery P-type regions and a plurality of periphery N-type regions, each of said region inside periphery cell area being separated from other said regions of periphery area;

covering said first P-type region, said second P-type region and said periphery P-type regions by a first photoresist;

forming a plurality of N-type sources and a plurality of N-type drains in said first N-type region, said second N-type region and said periphery N-type regions;

removing said first photoresist;

covering said periphery N-type regions and some said N-type drains which are located in both said first N-type region and said second N-type region by a second photoresist; and performing a large angle implanting process to form a plurality of P-type enlarged drains and a plurality of P-type enlarged sources in said periphery P-type regions, said first P-type region and said P-type second region, wherein a plurality of P-type extra sources also are formed on outsides of some said N-type drains which are located in both said first N-type region and said second N-type region.

2. The method of claim 1, further comprises forming a plurality of N-type light doped regions in said first N-type region, said second N-type region and said periphery N-type regions while said first photoresist being existent.

3. The method of claim 1, the distance between one said P-type extra source in said first N-type region and said N-type region in said first N-type region being smaller than the distance between said N-type source in said first N-type region and said N-type drain in said first N-type region.

4. The method of claim 1, the distance between one said P-type extra source in said second N-type region and said N-type region in said second N-type region being smaller than the distance between said N-type source in said second N-type region and said N-type drain in said second N-type region.

5. The method of claim 1, wherein the distance between one said P-type enlarged drain in said first P-type region and one said P-type enlarged source in said first P-type region is smaller than the width of a gate in said first P-type region.

6. The method of claim 1, wherein the distance between one said P-type enlarged drain in said second P-type region and one said P-type enlarged source in said second P-type region is smaller than the width of a gate in said second P-type region.

7. The method of claim 1, wherein said first P-type region and said second P-type region include no light doped region.

8. The method of claim 1, where the doped ions of said larger angle implanting process are the boron ions.

9. The method of claim 1, wherein the drain of said first P-type region is electrically coupled with both the source of said first N-type region and the gate of said second N-type region.

10. The method of claim 1, wherein the drain of said second P-type region is electrically coupled with both the source of said second N-type region and the gate of said first N-type region.

* * * * *